United States Patent
Juang et al.

(10) Patent No.: US 9,397,272 B2
(45) Date of Patent: Jul. 19, 2016

(54) PHOSPHOR AND LIGHT EMITTING DEVICE

(71) Applicant: Chi Mei Corporation, Tainan (TW)

(72) Inventors: Yuan-Ren Juang, Tainan (TW); Jen-Shrong Uen, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 1 day.

(21) Appl. No.: 14/077,285

(22) Filed: Nov. 12, 2013

(65) Prior Publication Data

US 2014/0291712 A1 Oct. 2, 2014

(30) Foreign Application Priority Data

Mar. 27, 2013 (TW) .............................. 102110885 A

(51) Int. Cl.
*H01L 33/50* (2010.01)
*C09K 11/08* (2006.01)
*C09K 11/77* (2006.01)

(52) U.S. Cl.
CPC .......... *H01L 33/502* (2013.01); *C09K 11/0883* (2013.01); *C09K 11/7734* (2013.01); *H01L 2224/48091* (2013.01); *H01L 2224/48247* (2013.01); *H01L 2224/8592* (2013.01); *H01L 2924/181* (2013.01); *Y10T 428/2982* (2015.01)

(58) Field of Classification Search
CPC ............ C01B 21/0823; C01B 21/0821; H01L 33/502; C09K 11/7728
See application file for complete search history.

(56) References Cited

U.S. PATENT DOCUMENTS

| | | | |
|---|---|---|---|
| 6,924,592 B2 | 8/2005 | Urabe | |
| 7,258,816 B2 | 8/2007 | Tamaki et al. | |
| 7,671,529 B2 * | 3/2010 | Mueller et al. | 313/503 |
| 8,203,259 B2 * | 6/2012 | Juang et al. | 313/484 |
| 8,663,500 B2 | 3/2014 | Emoto et al. | |
| 2006/0124947 A1 * | 6/2006 | Mueller et al. | 257/98 |
| 2008/0180948 A1 * | 7/2008 | Yoon | C09K 11/0883 362/230 |
| 2009/0243467 A1 | 10/2009 | Shimizu et al. | |
| 2009/0284948 A1 * | 11/2009 | Yamao et al. | 362/84 |
| 2010/0164365 A1 * | 7/2010 | Yoshino | C09K 11/7734 313/503 |
| 2011/0115366 A1 * | 5/2011 | Nagatomi et al. | 313/503 |
| 2011/0133629 A1 * | 6/2011 | Sakata et al. | 313/483 |
| 2011/0163322 A1 | 7/2011 | Yoo et al. | |
| 2011/0279018 A1 * | 11/2011 | Emoto et al. | 313/503 |
| 2012/0068595 A1 * | 3/2012 | Hanamoto et al. | 313/503 |
| 2012/0091879 A1 * | 4/2012 | Juang | C09K 11/0883 313/483 |

(Continued)

FOREIGN PATENT DOCUMENTS

CN 1818012 A 8/2006
CN 102300955 A 12/2011

(Continued)

OTHER PUBLICATIONS

Schlieper and Schlick: Nitridosilicate I, Hochtennperatursynthese und Kristallstruktur von Ca 2 Si 5 N 8 , Z. anorg. allg. Chem. 621, (1995), p. 1037-1041.

(Continued)

*Primary Examiner* — Ahmed Sefer
(74) *Attorney, Agent, or Firm* — McClure, Qualey & Rodack, LLP

(57) ABSTRACT

A phosphor and a light emitting device are provided. The phosphor comprises a composition having a formula of $(Ba_aSr_{1-a})_{2-z}Si_5O_bN_n:Eu_z$, $0.03<a<0.75$, $0<b<1$, $7<n<9$, and $0.03<z<0.3$.

18 Claims, 2 Drawing Sheets

(56) References Cited

U.S. PATENT DOCUMENTS

| | | | |
|---|---|---|---|
| 2012/0326593 A1* | 12/2012 | Juang | C09K 11/0883 313/483 |
| 2013/0200425 A1 | 8/2013 | Kashiwagi et al. | |
| 2013/0240943 A1* | 9/2013 | Schmidt | C09K 11/0883 257/98 |
| 2015/0203748 A1 | 7/2015 | Vosgroene et al. | |

FOREIGN PATENT DOCUMENTS

| | | | |
|---|---|---|---|
| CN | 104428395 A | | 3/2015 |
| JP | 2003277746 A | | 10/2003 |
| TW | 200419826 A | | 10/2004 |
| TW | 201343841 A | | 11/2013 |
| WO | 2012073177 A1 | | 6/2012 |
| WO | WO 2012073177 | * | 6/2012 |

OTHER PUBLICATIONS

Schlieper, Millus and Schlick: Nitridosilicate II, Hochtemperatursynthesen und Kristallstrukturen von $Sr_2Si_5N_8$ and $Ba_2Si_5N_8$, Z. anorg. allg. Chem. 621, (1995),p. 1380-1384.
CN Office Action dated Jul. 27, 2015 in corresponding Chinese application (No. 201310342647.8).
CN Office Action dated Feb. 10, 2015 in corresponding Chinese application (No. 201310130888.6).
Non-Final Office Action issued in U.S. Appl. No. 14/034,587, filed Sep. 24, 2013, mailed Apr. 24, 2015.
TW Office Action dated Aug. 8, 2014.
JP Office Action dated Jan. 13, 2015.
TW Office Action dated Nov. 7, 2014.
TW Office Action dated Jun. 5, 2014.
English Abstract translation of TW200419826 (Published Oct. 1, 2004).

* cited by examiner

PHOSPHOR AND LIGHT EMITTING DEVICE

This application claims the benefit of Taiwan application Serial No. 102110885, filed Mar. 27, 2013, the subject matter of which is incorporated herein by reference.

BACKGROUND OF THE INVENTION

1. Field of the Invention

The invention relates to a phosphor and a light emitting device comprising the same, and particularly to a phosphor and a light emitting device having high luminous brightness.

2. Description of the Related Art

In recent years, light emitting devices utilizing semiconductors for emitting lights have been intensively used. In particular, light emitting diodes (LED) have been developed successfully. Compared to conventional light emitting equipments, such as a cold cathode fluorescent lamp and an incandescent lamp, the light emitting devices utilizing light emitting diodes have advantages of higher emitting efficiency, smaller volumes, lower power consumption, and lower cost. Therefore, such light emitting devices are used as various light sources. A semiconductor light emitting device comprises a semiconductor light emitting element and a phosphor. The phosphor can absorb and convert a light emitted from the semiconductor light emitting element. The light emitted directly from the semiconductor light emitting element and the light converted and emitted from the phosphor can be mixed for use. The light emitting devices can be used in various applications, such as fluorescent light, car lighting, display devices, and backlight for liquid crystal displays. White light emitting devices are used extensively. Currently, a white light emitting device is formed by using YAG:Ce phosphor ($Y_3Al_5O_{12}$:Ce), the element Ce being the active center, together with a semiconductor light emitting element for emitting a blue light. However, the chromaticity coordinates of the mixed lights from the YAG:Ce phosphor and the blue-light semiconductor light emitting element is on a junction line between the chromaticity coordinates of the blue-light semiconductor light emitting element and the YAG:Ce phosphor. Therefore, the emitted mixed light is a white light lacking a red light, and of which the color rendering property and the color saturation property are apparently insufficient. In addition, the YAG:Ce phosphor has a major excitation spectrum area inconsistent with the light emitting region of the semiconductor light emitting element, thus conversion efficiency of the excited light is poor, and obtaining a white light source with high luminous brightness is difficult. For solving the issues of poor color hue and low luminous brightness, the YAG:Ce phosphor mixed with a phosphor for emitting a red light has been developed, and the quality of the red light phosphor has been improved, thereby increasing luminous brightness.

However, phosphors absorbing a blue light and converting it into a red light are rare. The developments and researches of such kind phosphors are focused on nitride and oxynitride phosphors. Currently known phosphors include $Sr_2Si_5N_8$:Eu phosphor using the element Eu as the active center, $CaAlSiN_3$:Eu phosphor, and sialon phosphor having a formula of $M_zSi_{12-(m+n)}Al_{m+n}O_nN_{16-n}$:Eu. However, luminous brightness of the $Sr_2Si_5N_8$:Eu phosphor is poor, and thus applications of the $Sr_2Si_5N_8$:Eu phosphor are limited and are not widely used. The sialon phosphor has adequate durability, but of which the luminous brightness is poor, thus the sialon phosphor is not popular. The $CaAlSiN_3$:Eu phosphor has better durability and better brightness compared to the sialon phosphor; however, there is still a need for further increasing the luminous brightness of phosphors for providing light emitting devices with higher light emitting efficiency.

SUMMARY OF THE INVENTION

The present invention provides a phosphor and a phosphor particle exhibiting high luminous brightness, and a light emitting device formed by using the phosphor and a semiconductor light emitting element, also exhibiting high luminous brightness.

According to an embodiment, a phosphor is provided. The phosphor comprises a composition having a formula of $(Ba_aSr_{1-a})_{2-z}Si_5O_bN_n$:$Eu_z$, $0.03<a<0.75$, $0<b<1$, $7<n<9$, and $0.03<z<0.3$.

According to another embodiment, a phosphor particle is provided. The phosphor particle comprises elements of barium (Ba), strontium (Sr), silicon (Si), and nitrogen (N), wherein the phosphor particle has an average particle diameter (D50) of larger than 6.2 μm and smaller than 14.4 μm.

According to a further embodiment, a phosphor particle is provided. The phosphor particle comprises elements of barium (Ba), strontium (Sr), silicon (Si), and nitrogen (N), wherein the phosphor particle has a long axis and a short axis, the long axis is the longest distance between any two points on the surface of the phosphor particle, and the short axis is the longest distance between any two points on a line on the surface of the phosphor particle, which is vertically intersected with the long axis, wherein the ratio of the long axis to the short axis is larger than 1.24 and smaller than 4.1.

According to a still further embodiment, a light emitting device is provided. The light emitting device comprises a semiconductor light emitting element and the phosphor. The phosphor is excited by an exciting light emitted from the semiconductor light emitting element and converts the exciting light to emit an emitting light having an emitting wavelength different from an exciting wavelength of the exciting light.

DETAILED DESCRIPTION OF THE INVENTION

In the embodiments of the present invention, a phosphor comprises elements of barium (Ba), strontium (Sr), silicon (Si), and nitrogen (N) is provided.

In an embodiment, the phosphor comprises a composition having a formula of $(Ba_aSr_{1-a})_{2-z}Si_5O_bN_n$:$Eu_z$, the phosphor with $0.03<a<0.75$, $0<b<1$, $7<n<9$, and $0.03<z<0.3$ has higher luminous brightness, which is measured after doing reliability test, compared to phosphors having the same emitting wavelength yet without the above-mentioned ranges of elemental ratio; that is, the above-mentioned phosphor of the present invention has a better brightness retention rate. Here, having the same emitting wavelength indicates a wavelength difference within ±1 nm. Brightness retention rate refers to a ratio of the brightness value before a reliability test to a brightness value after the reliability test, which equals to (brightness value before reliability test/brightness value after reliability test)*100%. In some embodiments, the phosphor satisfies a condition of $0.03<z<0.3$. In some embodiments, when the amount of Eu element in the illumination center of the phosphor is too low, it would result in a decreased brightness of an emitting light from the phosphor. In other embodiments, when the amount of Eu element in the illumination center of the phosphor is too high, it would result in a decreased brightness of an emitting light from the phosphor due to a concentration quenching phenomenon caused by interference between Eu atoms. In some embodiments, the phosphor satisfying a condition of $0.04 \leq z \leq 0.2$ can generate an emitting light having a preferable brightness.

In an embodiment, the phosphor comprises a composition having a formula of $(Ba_aSr_{1-a})_2Si_5O_bN_n:Eu_z$, the phosphor with $0.3 \leq a \leq 0.7$, $0 < b < 1$, $7 < n < 9$, and $0.04 \leq z \leq 0.2$ has a higher luminous brightness, which is measured after doing reliability test, compared to phosphors having the same emitting wavelength yet without the above-mentioned ranges of elemental ratio.

In some embodiments, when the phosphor of the present invention is excited by an exciting light having a wavelength of 455 nm, an emitting light emitted from the excited phosphor has a main wavelength of 580 nm-680 nm, and CIE 1931 chromaticity coordinates (x,y) of the emitting light from the phosphor is $0.45 \leq x \leq 0.72$, $0.2 \leq y \leq 0.5$. The main wavelength of an emitting light refers to a wavelength corresponding to the maximum luminous intensity in a luminescence spectrum.

Figure 1:
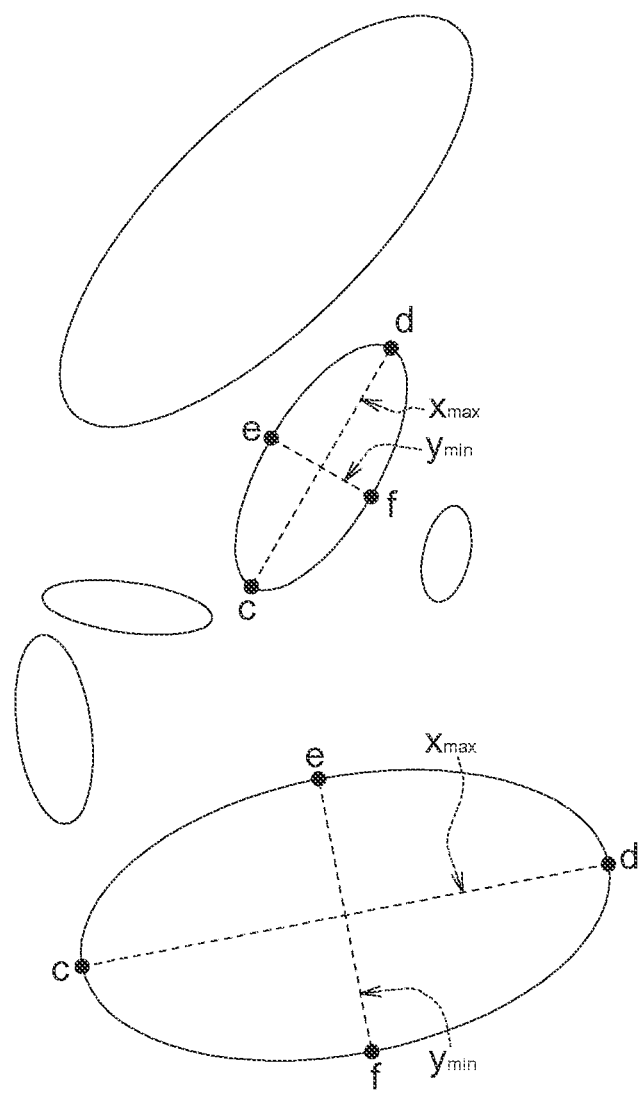
FIG. 1 shows a schematic drawing of a phosphor particle according to an embodiment of the present invention.

Referring to FIG. 1, a schematic drawing of a phosphor particle according to an embodiment of the present invention is shown. In this embodiment, the phosphor includes a plurality of phosphor particles. In other words, the phosphor takes the form of phosphor particles. In an embodiment, the phosphor particle comprises elements of barium (Ba), strontium (Sr), silicon (Si), and nitrogen (N). The phosphor particle has a long axis $x_{max}$ and a short axis $y_{min}$, the long axis $x_{max}$ is the longest distance between any two points c and d on the surface of the phosphor particle, and the short axis $y_{min}$ is the longest distance between any two points e and f on a line on the surface of the phosphor particle, which is vertically intersected with the long axis $x_{max}$. The ratio of the long axis $x_{max}$ to the short axis $y_{min}$ is larger than 1.24 and smaller than 4.1 ($1.24 < x_{max}/y_{min} < 4.1$).

In another embodiment, the phosphor includes a plurality of phosphor particles. In other words, the phosphor takes the form of phosphor particles. The average particle diameter is preferably equal to or smaller than 30 µm. The reason is that the illumination of phosphor particles mainly occurs on the surfaces of the particles, and if the average particle diameter is equal to or smaller than 30 µm, the surface area per unit weight of the phosphor particles will be assured, thus a decrease of brightness is avoided. Besides, when the phosphor particles are coated on a light emitting element, the density of the phosphor particles can be increased. From this viewpoint, the decrease of brightness can also be avoided. In addition, based on the viewpoint of the illumination efficiency of the phosphor particles, it is preferable that the average particle diameter is equal to or larger than 1 µm and smaller than 30 µm. Accordingly, the average particle diameter of the phosphor particle of the present invention is preferably larger than 1 µm and smaller than 30 µm, and in particular preferably larger than 3 µm and smaller than 20 µm. The so-called average particle diameter (D50) here is measured with Multisizer-3 by Beckman Coulter, Inc. utilizing Coulter counter method. D* indicates the value of the particle diameter at *% in the cumulative distribution. For example, D50 indicates the value of the particle diameter (µm) at 50% in the cumulative distribution; that is, D50 splits the cumulative distribution with half having diameters above and half having diameters below this D50 diameter. D50 is usually used to represent an average particle diameter of a sample.

In an embodiment, the average particle diameter (D50) of the phosphor particle is preferably larger than 6.2 µm and smaller than 14.4 µm (6.2 µm<D50 <14.4 µm).

In another embodiment, the 10% particle diameter (D10) of the phosphor particle is larger than 3.4 µm and smaller than 8.3 µm (3.4 µm<D10 <8.3 µm).

In some embodiments of the present invention, the phosphor particle may further comprise oxygen (O).

In some embodiments of the present invention, the phosphor particle comprises elements of barium (Ba), strontium (Sr), silicon (Si), and nitrogen (N). In an embodiment, for manufacturing the phosphor, a raw material for providing element Si may comprise a nitrogen containing compound, an oxygen containing compound, a compound having any suitable formula, or elemental silicon. In this embodiment, a mixture of silicon containing nitride/oxide ($Si_3N_4/SiO_x$) may be used. The oxygen containing compound may comprise an oxide, a carbonate, an oxalate, or other suitable compounds. The nitrogen containing compound refers to a compound containing both elements Si and N.

In other embodiments, raw materials for the phosphor may be various forms of precursors. For convenience, using a nitride and an oxide as raw materials is disclosed in the following examples. Oxides or nitrides of the elements of Ba, Sr, and Si may be merchant raw materials. Since raw materials with a higher degree of purity have better properties, it is preferable to prepare the raw materials having purity of higher than 3N (99.9%). Preferably, the particle diameter of each of the raw materials is designed to be micro-sized based on a viewpoint of promoting the reaction. However, the particle diameters and shapes of the phosphor obtained may vary according to the particle diameters and shapes of the raw materials. Therefore, the nitride and oxide raw materials may be prepared with particle diameters similar to that of the desired phosphor. The raw material for the element of Eu is preferably a merchant oxide, nitride, or metal, with a high degree of purity, preferably higher than 2N (99%), and more preferably higher than 3N (99.9%).

The raw materials may be mixed by a variety of methods, such as a dry method (e.g. a ball grinding in a dry condition) or a wet method (e.g. a ball grinding in a condition with a liquid), and the mixing method is not limited to a single method. Since the raw materials of $Sr_3N_2$, $Si_3N_4$, and $Ba_3N_2$ are compounds that would be oxidized easily, they should be properly handled in a glove box under an inactive atmosphere. In addition, it is suggested to use a dehydrated gas as an inactive gas to fill the glove box, since each of the nitrides of the raw materials would be influenced by moisture easily. Moreover, it is necessary to select a proper organic solvent for the wet method for mixing, such that decomposition of the raw materials resulted from water can be avoided. A ball mill, a mortar, or other common devices may be used as the mixer device.

In a manufacturing process of the phosphor, the raw materials may be weighed according to predetermined ratios, put in a crucible, and then sintered in a high temperature furnace. The high temperature furnace for the sintering process may be preferably a high temperature metallic resistor furnace or a high temperature graphite resistance furnace, since the sintering temperature is very high. The sintering process may be performed under an ambient atmospheric pressure, a pressure compressed by gas, or other conditions without applying any external mechanical pressure. The crucible is preferably made from a material of high degree of purity; that is, having an extreme small amount of impurity, such as a $Al_2O_3$ crucible, a $Si_3N_4$ crucible, a AlN crucible, a Sialon crucible, a boron nitride (BN) crucible, or other crucibles suitable for applications in the inactive environments, in which the BN crucible is preferred since it can provide a superior effect of preventing the impurity released by the crucible itself from mixing into the raw materials. The sintering ambiance may be non-oxidizing gas, such as nitrogen gas, hydrogen gas, ammonia gas, argon gas, or a combination thereof. The sintering temperature for the phosphor or the phosphor particle is 1200° C.-2200° C., preferably 1400° C.-2000° C. The heating rate is 3° C./min-15° C./min. Phosphor particles with relatively fine particle diameters can be manufactured at a relatively low sintering temperature, while phosphor particles having larger particle diameters can be manufactured at a relatively high sintering temperature. The sintering time may vary according to different types of the raw materials, which is usually 1-12 hours preferably. The sintering pressure under the inactive atmosphere may be, for example, equal to or lower than 0.5 MPa, particularly equal to or lower than 0.1 MPa preferably. After the sintering process, the phosphor may be further cooled to room temperature, pulverized by using the ball mill or a pulverizer, etc., and then washed by water, filtered, dried, and classified, etc.

In order to obtain the phosphor having high brightness, the impurity content in the phosphor composition should be as little as possible. The impurities may come from factors of adding a fluxing agent in the sintering process, impurities of the raw materials, contamination during the treatment processes, and etc. The high impurity content, particularly elements of fluorine, boron, chlorine, carbon, and etc, would inhibit light emitting. Therefore, the raw materials with a high degree of purity should be selected, and the synthesis process should be controlled for preventing contamination, in order to control the content of each of the elements of fluorine, boron, chlorine, carbon, and etc, to be lower than 1000 ppm.

The phosphor of the present invention is applicable to vacuum fluorescent displays (VFD), field emission displays (FED), plasma display panels (PDP), cathode ray tubes (CRT), light emitting diodes, and etc. Particularly, when the phosphor is excited by a light having a wavelength of 455 nm, an emitting light from the excited phosphor has a main wavelength of 580 nm-680 nm and CIE 1931 chromaticity coordinates (x,y) of $0.45 \leq x \leq 0.72$ and $0.2 \leq y \leq 0.5$, and has high brightness, thus the phosphor is suitable for light emitting diodes.

The light emitting device of the present invention comprises a semiconductor light emitting element and the phosphor of the present invention. Preferably, the semiconductor light emitting element can emit a light having a wavelength of 300 nm-550 nm. Particularly, the semiconductor light emitting element may be a ultraviolet (or violet) semiconductor light emitting element for emitting a ultraviolet (or violet) light having a wavelength of 330 nm-420 nm, or a blue semiconductor light emitting element for emitting a blue light having a wavelength of 420 nm-500 nm. As a semiconductor light emitting element, semiconductors may be zinc sulfide or gallium nitride. In one embodiment, gallium nitride is preferred for considering illumination efficiency. Gallium nitride may be formed on a substrate by a metal-organic chemical vapor deposition (MOCVD) method, a hydride vapor phase epitaxy (HVPE) method, and etc. In one embodiment, the light emitting element formed from $In_\alpha Al_\beta Ga_{1-\alpha-\beta}N$ ($0 \leq \alpha$, $0 \leq \beta$, $\alpha+\beta<1$) is preferable. The semiconductor structure may use MIS junction, PIN junction, and/or PN junction of homo junction structure, hetero junction structure, or double hetero junction structure. The wavelength of the emitting light may be controlled by adjusting the materials or the crystal mix degree of semiconductor layers.

The phosphor of the present invention may be used singly as well as by cooperating with other phosphors having different light emitting characteristics, thereby constructing light emitting devices capable of emitting a light with desired color(s). In one embodiment, a light emitting element of the present invention may be manufactured by assembling an ultraviolet light emitting element, which emits a light having a wavelength of 330 nm-420 nm, a blue phosphor (e.g. $BaMgAl_{10}O_{17}$:Eu) for emitting light with a wavelength of 420 nm-500 nm after being excited by the emitting light of the ultraviolet light emitting element, a green phosphor (e.g. β-sialon phosphor) for emitting light with a wavelength of 500 nm-570 nm after being excited by the emitting light of the ultraviolet light emitting element, and the phosphor of the present invention. Accordingly, red light, green light, and blue light will be emitted respectively when the phosphors are illuminated by the ultraviolet light emitted from the light emitting element, and the lights will be mixed to generate a white light for the light emitting device.

In another embodiment, a blue light emitting element, which emits a light having a wavelength of 420 nm-500 nm, a yellow phosphor (e.g. $Y_3Al_5O_{12}$:Ce) for emitting light with a wavelength of 550 nm-600 nm after being excited by the emitting light of the blue light emitting element, and the phosphor of the present invention can be assembled as well. Accordingly, red light and yellow light will be emitted respectively when the phosphors are illuminated by the blue light emitted from the light emitting element, and the red light and the yellow light will be mixed with the blue light to generate a white light for the light emitting device, such as a light apparatus or a light bulb.

In another embodiment, a blue light emitting element, which emits a light having a wavelength of 420 nm-500 nm, a green phosphor (e.g. β-sialon phosphor) for emitting light with wavelength of 500 nm-570 nm after being excited by the emitting light of the blue light emitting element, and the phosphor of the present invention can be assembled as well. Accordingly, red light and green light will be emitted respectively when the phosphors are illuminated by the blue light emitted from the light emitting element, and the red light and the green light will be mixed with the blue light to generate a white light for the light emitting device, such as a light apparatus.

Embodiment and Comparative Example

The present invention is illustrated with the following embodiments, but is not limited thereto.

Measurement Methods (1) Brightness and chromaticity coordinates of phosphor(s): The brightness of the phosphor and the chromaticity coordinates were measured with a TOPCON brightness meter (SR-3A) set to emit light with wavelength of 455 nm. Measurement inaccuracy in measured values is within ±0.3%.

(2) Main wavelength of light from phosphor: The main wavelength was measured with Fluoro Max-3 of Jobin YVON. The main wavelength refers to a wavelength corresponding to the maximum luminous intensity in a luminescence spectrum of the phosphor excited by light with wavelength of 455 nm.

(3) Composition analysis of phosphor(s):

(3-1a) Instrument: The measurement was carried out with inductively coupled plasma atomic emission spectrometer (ICP) (ULTIMA-2 type, Jobin Yvon Technology).

(3-1b) Pretreatments of sample(s): A sample of 0.1 gram was accurately weighed and placed in a platinum crucible. 1 gram of $Na_2CO_3$ was added into the platinum crucible and mixed with the sample uniformly. Then, the mixture was fused by a high temperature furnace at 1200° C. (heating condition: temperature was raised from room temperature to 1200° C. in 2 hours and stayed at 1200° C. for 5 hours). The fusion product was then cooled and added into an acid solution, such as 25 mL of HCl (36%), and then heated to be dissolved until the solution was clear. The solution was then placed into a 100 mL PFA volumetric flask after being cooled and quantitatively added with pure water to the marked line of the flask.

(3-2a) Instrument: Nitrogen and Oxygen analyzer (Horiba Ltd., EMGA-620W).

(3-2b) Measurement: 20 mg of the phosphor was placed into a Sn capsule, and then the capsule was placed in a crucible to be measured.

(4) Reliability test: The phosphor is placed in the air and baked at a high temperature for a long period of time (400° C., 12 h)

(5) Brightness retention rate: Brightness retention rate refers to the ratio of the brightness value before a reliability test to the brightness value after the reliability test, which equals to (brightness value before reliability test/brightness value after reliability test)*100%.

Synthesis Example 1

Sr metal (3N7, 99.97%) and Ba metal (2N, 99%) were pulverized and then sintered under a pure nitrogen ambience at 750° C. and 700° C., respectively, for 24 hours to form $Sr_3N_2$ and $Ba_3N_2$, respectively.

Embodiment 1 Through Embodiment 11 and Comparative Example 1 Through Comparative Example 3

The phosphors of embodiments 1-11 and comparative examples 1-3 were synthesized by similar methods, and the differences are the usage amounts of $Ba_3N_2$, $Sr_3N_2$, $Si_3N_4$, and $Eu_2O_3$. The synthesis method for the phosphor of embodiment 1 is illustrated in the following as an example.

In embodiment 1, 49.293 g of $Sr_3N_2$ of synthesis example 1, 42.094 g of $Ba_3N_2$, 95.862 g of $Si_3N_4$ (purity: 3N), and 4.329 g of $Eu_2O_3$ (purity: 4N) were weighed and mixed by using a mortar in a glove box under a nitrogen environment to form a raw material for the phosphor.

Then, the raw material for the phosphor was placed in a sintering container made of boron nitride, followed by placing the sintering container with the raw material therein in a high temperature furnace under a highly pure nitrogen atmosphere. The gas flow rate of the nitrogen was set at 80 liter/min. The temperature was raised to 1700° C. at a heating rate of 10° C/min and maintained at 1700° C. for 2 hours, and the operating pressure of the high temperature furnace was maintained at 0.1 MPa to proceed with the sintering process. After the sintering process, the temperature was cooled to room temperature at a cooling rate of 10° C./min. The steps of pulverizing, ball milling, washing with water twice, filtering, drying, and sorting, etc., were performed to the sintered mixture to obtain the phosphor.

Table 1 lists the types of source compounds of the raw material, weight of each source compound, and the sintering conditions for the phosphors in the embodiments and the comparative examples. Tables 2 and 3 list the properties of the phosphors, including the amounts of each element as feeding, wavelengths of emitting lights, brightness, and brightness retention rates thereof after reliability test. The main wavelength of an emitting light from the phosphor refers to a wavelength corresponding to the maximum luminous intensity in the luminescence spectrum.

In embodiment 8, analysis results obtained from the Nitrogen and Oxygen analyzer and ICP show that the phosphor has a composition formula of $Ba_{0.666}Sr_{1.207}Si_5O_{0.149}N_{7.415}$:$Eu_{0.04}$.

TABLE 1

| | Sintering conditions | | Weight (grams) | | | |
| --- | --- | --- | --- | --- | --- | --- |
| | Temperature (° C.) | Time (hr) | $Ba_3N_2$ | $Sr_3N_2$ | $Si_3N_4$ | $Eu_2O_3$ |
| Comparative example 1 | 1700 | 4 | 90.201 | 12.721 | 95.862 | 12.986 |
| Comparative example 2 | 1800 | 8 | 96.214 | 7.951 | 95.862 | 14.429 |
| Embodiment 1 | 1700 | 2 | 42.094 | 49.293 | 95.862 | 4.329 |
| Embodiment 2 | 1700 | 4 | 75.167 | 24.647 | 95.862 | 9.379 |
| Embodiment 3 | 1700 | 4 | 60.134 | 36.573 | 95.862 | 5.772 |
| Embodiment 4 | 1700 | 4 | 42.094 | 49.293 | 95.862 | 4.329 |
| Embodiment 5 | 1700 | 4 | 18.040 | 65.791 | 95.862 | 3.247 |
| Embodiment 6 | 1700 | 6 | 42.094 | 49.293 | 95.862 | 4.329 |
| Embodiment 7 | 1750 | 6 | 42.094 | 49.293 | 95.862 | 4.329 |
| Embodiment 8 | 1750 | 8 | 42.094 | 49.293 | 95.862 | 4.329 |
| Embodiment 9 | 1750 | 12 | 42.094 | 49.293 | 95.862 | 4.329 |
| Embodiment 10 | 1800 | 2 | 42.094 | 49.293 | 95.862 | 4.329 |
| Embodiment 11 | 1800 | 8 | 75.167 | 24.647 | 95.862 | 9.379 |

TABLE 2

| | Elemental compositions as feeding | | | | | |
| --- | --- | --- | --- | --- | --- | --- |
| | Sr | Ba | Eu | Si | N | O |
| Comparative example 1 | 0.32 | 1.5 | 0.18 | 5 | 7.88 | 0.27 |
| Comparative example 2 | 0.2 | 1.6 | 0.2 | 5 | 7.87 | 0.3 |

TABLE 2-continued

| | Elemental compositions as feeding | | | | | |
|---|---|---|---|---|---|---|
| | Sr | Ba | Eu | Si | N | O |
| Embodiment 1 | 1.24 | 0.7 | 0.06 | 5 | 7.96 | 0.09 |
| Embodiment 2 | 0.62 | 1.25 | 0.13 | 5 | 7.92 | 0.20 |
| Embodiment 3 | 0.92 | 1 | 0.08 | 5 | 7.95 | 0.12 |
| Embodiment 4 | 1.24 | 0.7 | 0.06 | 5 | 7.96 | 0.09 |
| Embodiment 5 | 1.655 | 0.3 | 0.045 | 5 | 7.97 | 0.07 |
| Embodiment 6 | 1.24 | 0.7 | 0.06 | 5 | 7.96 | 0.09 |
| Embodiment 7 | 1.24 | 0.7 | 0.06 | 5 | 7.96 | 0.09 |
| Embodiment 8 | 1.24 | 0.7 | 0.06 | 5 | 7.96 | 0.09 |
| Embodiment 9 | 1.24 | 0.7 | 0.06 | 5 | 7.96 | 0.09 |
| Embodiment 10 | 1.24 | 0.7 | 0.06 | 5 | 7.96 | 0.09 |
| Embodiment 11 | 0.62 | 1.25 | 0.13 | 5 | 7.92 | 0.20 |

TABLE 3

| | Wavelength of emitting light | Brightness (cd/m$^2$) | Brightness after reliability test | Brightness retention |
|---|---|---|---|---|
| Comparative example 1 | 620 ± 1 | 118 | 18 | 15 |
| Comparative example 2 | 620 ± 1 | 102 | 41 | 40 |
| Embodiment 1 | 620 ± 1 | 103 | 24 | 23 |
| Embodiment 2 | 620 ± 1 | 119 | 24 | 20 |
| Embodiment 3 | 620 ± 1 | 122 | 43 | 38 |
| Embodiment 4 | 620 ± 1 | 113 | 46 | 41 |
| Embodiment 5 | 620 ± 1 | 110 | 84 | 76 |
| Embodiment 6 | 620 ± 1 | 122 | 93 | 76 |
| Embodiment 7 | 620 ± 1 | 123 | 116 | 94 |
| Embodiment 8 | 620 ± 1 | 126 | 101 | 80 |
| Embodiment 9 | 620 ± 1 | 114 | 91 | 58 |
| Embodiment 10 | 620 ± 1 | 118 | 97 | 82 |
| Embodiment 11 | 620 ± 1 | 124 | 105 | 85 |

As shown in Table 3, the phosphors of embodiments and comparative examples all have good brightness. However, after reliability test, the phosphors of the embodiments have better brightness compared to that of the comparative examples, and thus the phosphors of the embodiments have better brightness retention rates. Particularly, the phosphors of embodiments 6-10 show better brightness performance after reliability test.

Table 4 shows the synthetic conditions and properties of the phosphors of embodiments 1, 4, 6-10 and comparative example 3, including sintering conditions, brightness, particle diameters, brightness, and brightness retention rates after reliability test. The elemental compositions as feeding for the phosphors of embodiments 1, 4, 6-10 and comparative example 3 are the same, wherein Sr:Ba:Eu=1.24:0.7:0.06 and wavelengths of emitting lights are all 620±1 nm. In Table 4, D10 refers to the 10% particle diameters, D50 refers to the average particle diameters, and D90 refers to the 90% particle diameters of the phosphors.

TABLE 4

| | Sintering conditions | | Brightness (cd/m$^2$) | Particle diameter | | | Brightness after reliability | Brightness retention rate (%) |
|---|---|---|---|---|---|---|---|---|
| | Temperature | Time (hr) | | D10 | D50 | D90 | | |
| Comparative example 3 | 1800 | 8 | 113 | 8.3 | 14.4 | 21.9 | 55 | 49 |
| Embodiment 1 | 1700 | 2 | 103 | 2.5 | 4.4 | 10.4 | 24 | 23 |
| Embodiment 4 | 1700 | 4 | 113 | 3.4 | 6.2 | 13 | 46 | 41 |
| Embodiment 6 | 1700 | 6 | 122 | 4.2 | 10.2 | 18.8 | 93 | 76 |
| Embodiment 7 | 1750 | 6 | 123 | 5.1 | 11.1 | 18.9 | 116 | 94 |
| Embodiment 8 | 1750 | 8 | 126 | 6.3 | 12.7 | 20.8 | 101 | 80 |
| Embodiment 9 | 1750 | 12 | 114 | 7.5 | 14.2 | 20.5 | 66 | 58 |
| Embodiment 10 | 1800 | 2 | 118 | 6.5 | 11.9 | 19.6 | 97 | 82 |

As shown in Table 4, among embodiments 1, 4, 6-10 and comparative example 3, while the elemental compositions as feeding are the same (Sr:Ba:Eu=1.24:0.7:0.06), the phosphors with average particle diameters (D50) larger than 6.2 μm and smaller than 14.4 μm and 10% particle diameters (D10) larger than 3.4 μm and smaller than 8.3 μm (e.g. embodiments 6-10) have better brightness retention rates. While the average particle diameters (D50) and 10% particle diameters (D10) exceed the above-mentioned ranges (e.g. embodiments 1, 4 and comparative example 3), the phosphors merely have brightness retentions rates of below 49%. Besides, while the sintering time increases with the sintering temperature, the particle diameters (D10, D50 and D90) of the phosphors may increase, however, the phosphors would deteriorate, resulting in the decrease of brightness retention rates of the phosphors.

Table 5 shows the synthetic conditions and properties of the phosphors of embodiment 11 and comparative examples 1 and 3, including sintering conditions, brightness, elemental compositions as feeding, brightness, brightness retention rates after reliability test, and ratios of long axis to short axis. The wavelengths of emitting lights of embodiment 11 and comparative examples 1 and 3 are all 620±1 nm.

TABLE 5

| | Sintering conditions | | Elemental compositions as | | | Brightness | Brightness retention rates (%) | Ratio of long axis/short axis |
|---|---|---|---|---|---|---|---|---|
| | Temperature | Time (hr) | Sr | Ba | Eu | | | |
| Comparative example 1 | 1700 | 4 | 0.32 | 1.5 | 0.18 | 118 | 15 | 1.24 |
| Comparative example 3 | 1800 | 8 | 0.2 | 1.6 | 0.2 | 102 | 40 | 4.1 |
| Embodiment 11 | 1800 | 8 | 0.62 | 1.25 | 0.13 | 124 | 85 | 2.1 |

As shown in Table 5, when the ratios of long axis to short axis are larger than 1.24 and smaller than 4.1 ($1.24 < x_{max}/y_{min} < 4.1$) (e.g. embodiment 11), the phosphors have better brightness retention rates.

According to the results of the composition analysis as shown above, the atomic ratios of the elements (Ba, Sr, Si, O, N, and Eu) are slightly different from the elemental compositions as feeding. Such difference is believed to be caused by the small amount of the raw material which is decomposed, evaporated, or not entering the lattice during the sintering process and washed off by water, or may be analytical errors. Particularly, the difference in the b values for the atomic ratio of oxygen is believed to be caused by, such as, the oxygen content initially existed in the raw material, oxygen adsorbed on the surface of the raw material, oxygen mixed into the raw material as the raw material was weighed, mixed or sintered, oxygen from the oxidation of the surface of the raw material, and/or the moisture or oxygen adsorbed on the surface of the phosphor after sintered. In addition, while the sintering process is carried out under a nitrogen and/or ammonia atmosphere, oxygen in the raw material may be replaced by nitrogen, thereby errors of b and n values may occur.

Figure 2:
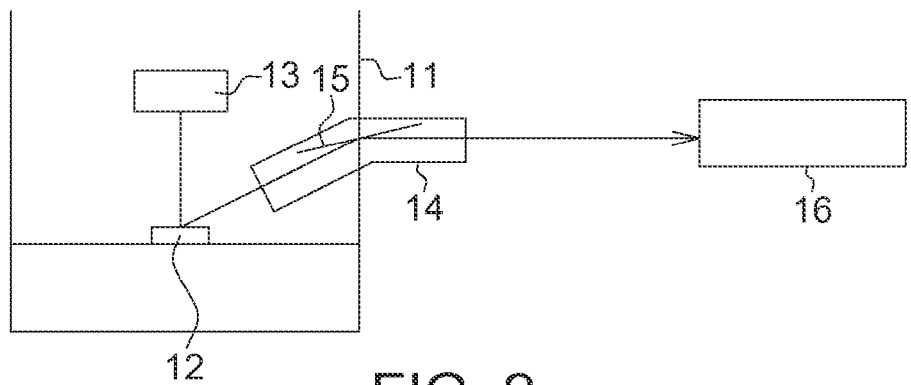
FIG. 2 shows a brightness measurement apparatus applied in the present invention.

Referring to FIG. 2, a brightness measurement apparatus is shown. The brightness values of the phosphors above-mentioned are all measured by this brightness measurement apparatus. As shown in FIG. 2, the brightness measurement apparatus includes a black box body 11, a sample holder 12, a light source 13, a light guide tube 14, a reflective mirror 15, and a brightness meter 16. The sample holder 12 is placed inside the black box body 11. The light source 13 is disposed vertically above the sample with a distance of 5 cm away from the sample. The light guide tube 14 has a diameter of 2 cm and forms an angle of 45° with the light source 13. The reflective mirror 15 is disposed inside the light guide tube 14 with a distance of 8 cm from the sample holder 12, and the distance between the brightness meter 16 and the reflective mirror 15 is 40 cm. As a phosphor is irradiated with the light source 13, the fluorescent light emitted from the phosphor is directly guided to the brightness meter 16 to be measured via the light guide tube 14 and the reflective mirror 15. Due to the value of measured brightness of phosphor is changed with an intensity of the light source 13, it is better to normalize the value of measured brightness with a standard to eliminate a measurement inaccuracy caused by an intensity change of the light source 13.

Specifically, the measurements of the above-mentioned embodiments and comparative examples are carried out as follows. 1.3 grams of sample is taken into the sample holder 12 and pressed, so that the sample is uniformly distributed in the sample holder 12. The sample holder 12 is then placed inside the black box body 11. The light source 13 with wavelength of 455 nm is used to vertically irradiate the sample. The fluorescent light is directly guided to the brightness meter 16 (TOPCON, SR-3A). The brightness meter 16 applies a field 1° detection mode.

The phosphor samples of the above-mentioned embodiments and semiconductor light emitting elements are packed for manufacturing light emitting devices of the present invention.

Figure 3:
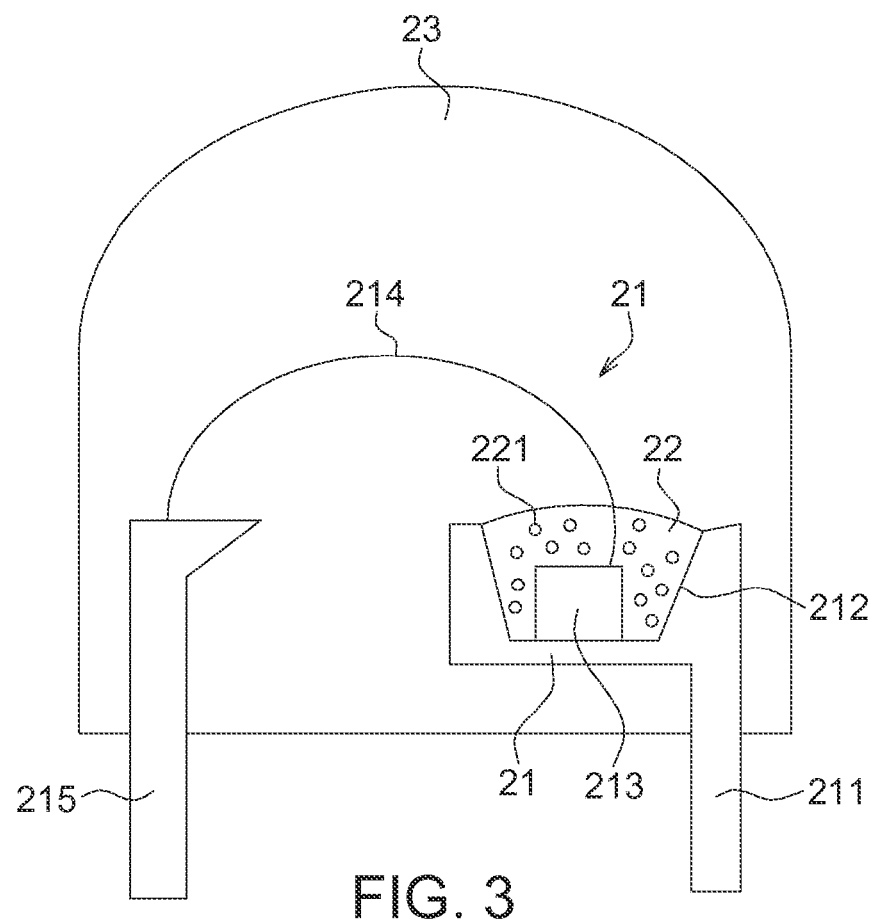
FIG. 3 shows a perspective view of a light emitting device according to an embodiment of the present invention.

Referring to FIG. 3, a perspective view of a light emitting device according to an embodiment of the present invention is shown. As shown in FIG. 3, the light emitting device comprises a light emitting unit 21, a fluorescence layer 22, and an encapsulating layer 23.

The light emitting unit 21 comprises a conductive base 211 having a concave holding surface 212, a light emitting diode chip 213 disposed on the concave holding surface 212 and electrically connected to the base 211, a connecting wire 214, and a conducting wire 215 electrically connected to the light emitting diode chip 213 via the connecting wire 214. The base 211 and the conducting wire 215 can cooperate to supply external electrical energy to the light emitting diode chip 213. The light emitting diode chip 213 can convert the electrical energy to light energy and emit it out. An example of the present invention is to adhere a commercial available InGaN blue light emitting diode chip 213 (Chi Mei Lighting Technology Corp.) of light emitting wavelength of 455 nm on the concave holding surface 212 of the base 211 with a conductive silver paste (BQ6886, Uninwell International), and then the connecting wire 214 and the conducting wire 215 electrically connected to the light emitting diode chip 213.

A fluorescence layer 22 covers the light emitting diode chip 213. After the fluorescent material 221 contained in the fluorescence layer 22 is excited by the light emitted from the light emitting diode chip 213, the fluorescent material 221 converts the light emitted from the light emitting diode chip 213 to an emitting light having an emitting wavelength different from an exciting wavelength of the exciting light. In an embodiment, the fluorescence layer 22 is formed by coating a polysiloxane resin having 35 wt % of the fluorescent material 221 on the external surface of the light emitting diode chip 213, followed by drying and hardening.

An encapsulant 23 covers a part of the base 211 of the light emitting unit 21, the connecting wire 214, a part of the conducting wire 215, and the fluorescence layer 22.

In summary, the phosphors according to the embodiments of the present invention have high luminous brightness. In addition, light emitting devices with high brightness can be manufactured by using the phosphors of the present invention and semiconductor light emitting elements.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phosphor, wherein the phosphor comprises a composition having a formula of $(Ba_aSr_{1-a})_{2-z}Si_5O_bN_n:Eu_z$, $0.03 \leq a \leq 0.7$, $0 < b < 1$, $7 < n < 9$, and $0.04 \leq z \leq 0.2$.

2. The phosphor according to claim 1, wherein Ba:Sr:Eu is 0.1-1.45:0.5-1.7:0.05-0.2.

3. The phosphor according to claim 1, wherein Ba:Sr:Eu is 0.7-1.25:0.62-1.24:0.06-0.13.

4. The phosphor according to claim 1, wherein when the phosphor is excited by an exciting light having a wavelength of 455 nm, a visible light is emitted from the phosphor, color coordinate (x, y) of the visible light base on CIE 1931 chromaticity diagram is $0.45 \leq x \leq 0.72$, $0.2 \leq y \leq 0.5$.

5. The phosphor according to claim 1, wherein the phosphor comprises a plurality of phosphor particles.

6. The phosphor according to claim 5, wherein the phosphor particles have an average particle diameter (D50) of larger than 6.2 μm and smaller than 14.4 μm.

7. The phosphor according to claim 5, wherein the phosphor particles have a 10% particle diameter (D10) of larger than 3.4 μm and smaller than 8.3 μm.

8. The phosphor according to claim 5, wherein each of the phosphor particles has a long axis and a short axis, the long axis is the longest distance between any two points on the surface of the phosphor particle, and the short axis is the longest distance between any two points on a line on the surface of the phosphor particle, which is vertically intersected with the long axis, wherein the ratio of the long axis to the short axis is larger than 1.24 and smaller than 4.1.

9. A light emitting device, comprising:
a semiconductor light emitting element; and
the phosphor according to claim 1, wherein the phosphor is excited by an exciting light emitted from the semiconductor light emitting element and converts the exciting light to emit an emitting light having an emitting wavelength different from an exciting wavelength of the exciting light.

10. A phosphor particle, comprising elements of barium (Ba), strontium (Sr), silicon (Si), and nitrogen (N), wherein the phosphor particle has an average particle diameter (D50) of larger than 6.2 μm and smaller than 14.4 μm, the phosphor particle has a long axis and a short axis, the long axis is the longest distance between any two points on the surface of the phosphor particle, and the short axis is the longest distance between any two points on a line on the surface of the phosphor particle, which is vertically intersected with the long axis, wherein the ratio of the long axis to the short axis is larger than 1.24 and smaller than 4.1.

11. The phosphor particle according to claim 10, further comprising oxygen (O).

12. The phosphor particle according to claim 10, wherein the phosphor particle has a 10% particle diameter (D10) of larger than 3.4 μm and smaller than 8.3 μm.

13. The phosphor particle according to claim 10, wherein when the phosphor particle is excited by an exciting light having a wavelength of 455 nm, a visible light is emitted from the phosphor, color coordinate (x, y) of the visible light base on CIE 1931 diagram is $0.45 \leq x \leq 0.72$, $0.2 \leq y \leq 0.5$.

14. The phosphor particle according to claim 10, wherein a composition ratio of Ba/Sr is 0.394~2.54.

15. A phosphor particle, comprising elements of barium (Ba), strontium (Sr), silicon (Si), and nitrogen (N), wherein the phosphor particle has a long axis and a short axis, the long axis is the longest distance between any two points on the surface of the phosphor particle, and the short axis is the longest distance between any two points on a line on the surface of the phosphor particle, which is vertically intersected with the long axis, wherein the ratio of the long axis to the short axis is larger than 1.24 and smaller than 4.1.

16. The phosphor particle according to claim 15, further comprising oxygen (O).

17. The phosphor particle according to claim 15, wherein when the phosphor particle is excited by an exciting light having a wavelength of 455 nm, a visible light is emitted from the phosphor, color coordinate (x, y) of the visible light base on CIE 1931 chromaticity diagram is $0.45 \leq x \leq 0.72$, $0.2 \leq y \leq 0.5$.

18. The phosphor particle according to claim 15, wherein a composition ratio of Ba/Sr is 0.394~2.54.

* * * * *